(12) United States Patent
Chen

(10) Patent No.: US 12,349,326 B2
(45) Date of Patent: Jul. 1, 2025

(54) ANTI-MAGNETIC INTERFERENCE COMPONENT AND ELECTRONIC DEVICE

(71) Applicant: TRIPLE WIN TECHNOLOGY(SHENZHEN) CO.LTD., Shenzhen (CN)

(72) Inventor: Chin-Ting Chen, New Taipei (TW)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 219 days.

(21) Appl. No.: 18/233,353

(22) Filed: Aug. 14, 2023

(65) Prior Publication Data

US 2024/0260242 A1 Aug. 1, 2024

(30) Foreign Application Priority Data

Jan. 30, 2023 (CN) .......................... 202320088328.8

(51) Int. Cl.
*H05K 9/00* (2006.01)
*H05K 1/02* (2006.01)

(52) U.S. Cl.
CPC ......... *H05K 9/0022* (2013.01); *H05K 1/0274* (2013.01); *H05K 2201/10121* (2013.01)

(58) Field of Classification Search
CPC ............... H05K 9/0022; H05K 1/0274; H05K 2201/10121
See application file for complete search history.

(56) References Cited

U.S. PATENT DOCUMENTS

| 6,870,094 B2 * | 3/2005 | Otaki ................ H01R 13/6596 361/752 |
| 7,999,195 B2 * | 8/2011 | Huang ................ H05K 9/0026 174/382 |
| 2011/0080721 A1 * | 4/2011 | Yukiyoshi ............ H05K 9/0054 361/816 |

* cited by examiner

*Primary Examiner* — Pete T Lee
(74) *Attorney, Agent, or Firm* — ScienBiziP, P.C.

(57) ABSTRACT

An anti-magnetic interference component includes a circuit board, a plurality of electronic components disposed on the circuit board, a flexible board, and at least one first electromagnetic shielding film. The flexible board includes a covering portion and two connecting portions. The covering portion can be bend relative to each of the two connecting portions, the two connecting portions is connected to the circuit board, the covering portion can cover and space apart from the circuit board when the covering portion is bend relative to the two connecting portions, causing the covering portion and the circuit board to cooperatively form an accommodation space for receiving the electronic components. The first electromagnetic shielding film is disposed on the covering portion and the two connecting portions, the first electromagnetic shielding film can face the plurality of electronic components when the covering portion covers the circuit board.

18 Claims, 7 Drawing Sheets

ANTI-MAGNETIC INTERFERENCE COMPONENT AND ELECTRONIC DEVICE

FIELD

The subject matter herein generally relates to anti-magnetic, and more particularly, to an anti-magnetic interference component and an electronic device.

BACKGROUND

Electronic components, which are disposed on a circuit board, may suffer from interference of external electromagnetic waves. A metal shell can be disposed on the circuit board to cover the electronic components to shield the electromagnetic waves. However, the circuit board requires a large surface area not only for the wirings and also for the metal shell, limiting the application of such circuit board in a miniature electronic device. Moreover, the electromagnetic shielding shell cannot be applied for various kinds of circuit boards since positions of the electronic components, a size of the circuit board, and the layout of the wirings may be different, resulting in high manufacturing costs. Therefore, there is a room for improvement in the art.

BRIEF DESCRIPTION OF THE DRAWINGS

Implementations of the present technology will now be described, by way of example only, with reference to the attached figures.

DETAILED DESCRIPTION

Figure 1:
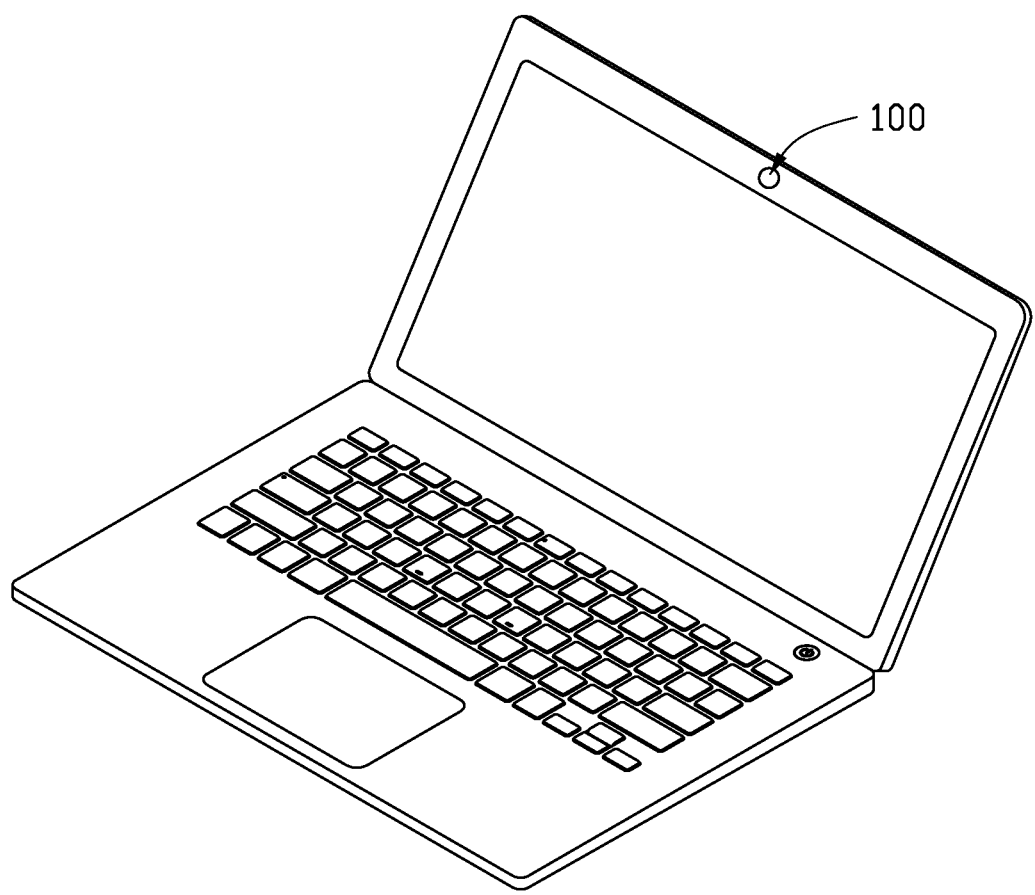
FIG. 1 is a diagrammatic view of an embodiment of an electronic device including an anti-magnetic interference component according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Some embodiments of the present disclosure will be described in detail with reference to the drawings. If no conflict, the following embodiments and features in the embodiments can be combined with each other.

Referring to FIG. 1, an electronic device 300 including an anti-magnetic interference component 100 is provided according to an embodiment of the present disclosure. The electronic device 300 can be a mobile phone, a notebook, a wearable device, a vehicle, a camera, or a monitoring device, and the like. In the embodiment, the electronic device 300 is a notebook.

Figure 2:
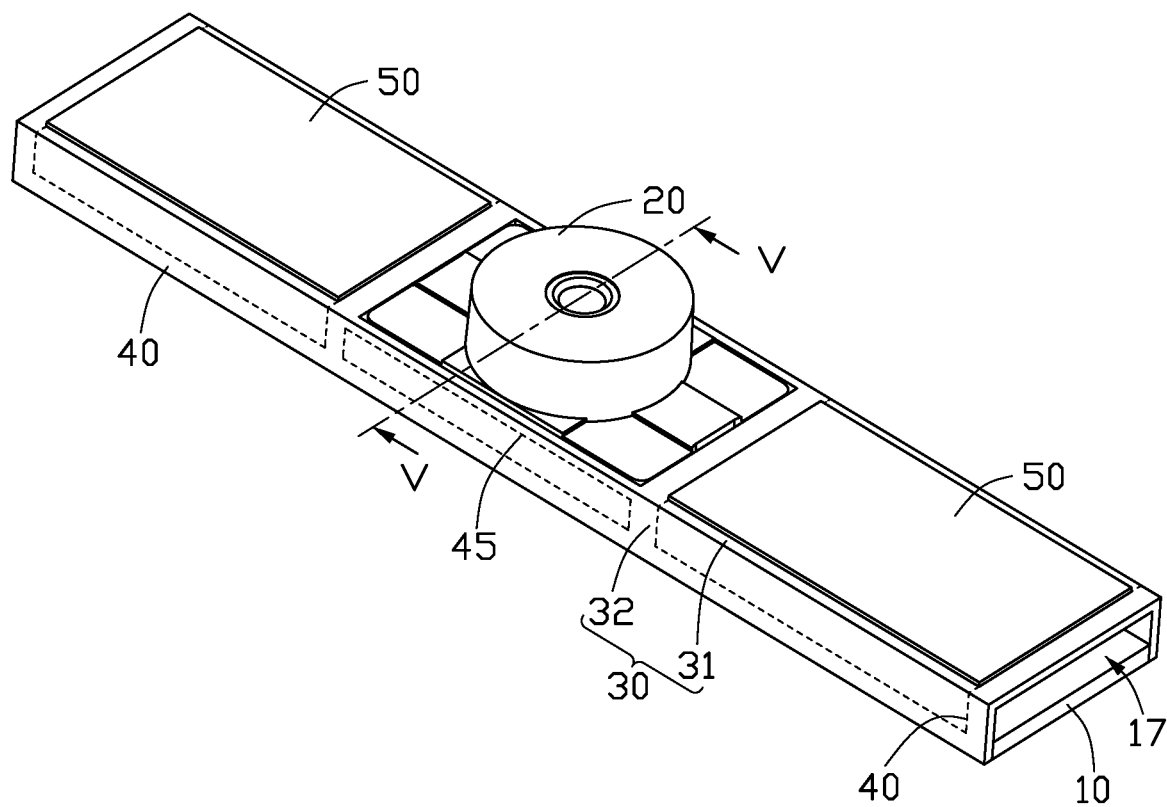
FIG. 2 is a diagrammatic view of the anti-magnetic interference component of FIG. 1.
Figure 3:
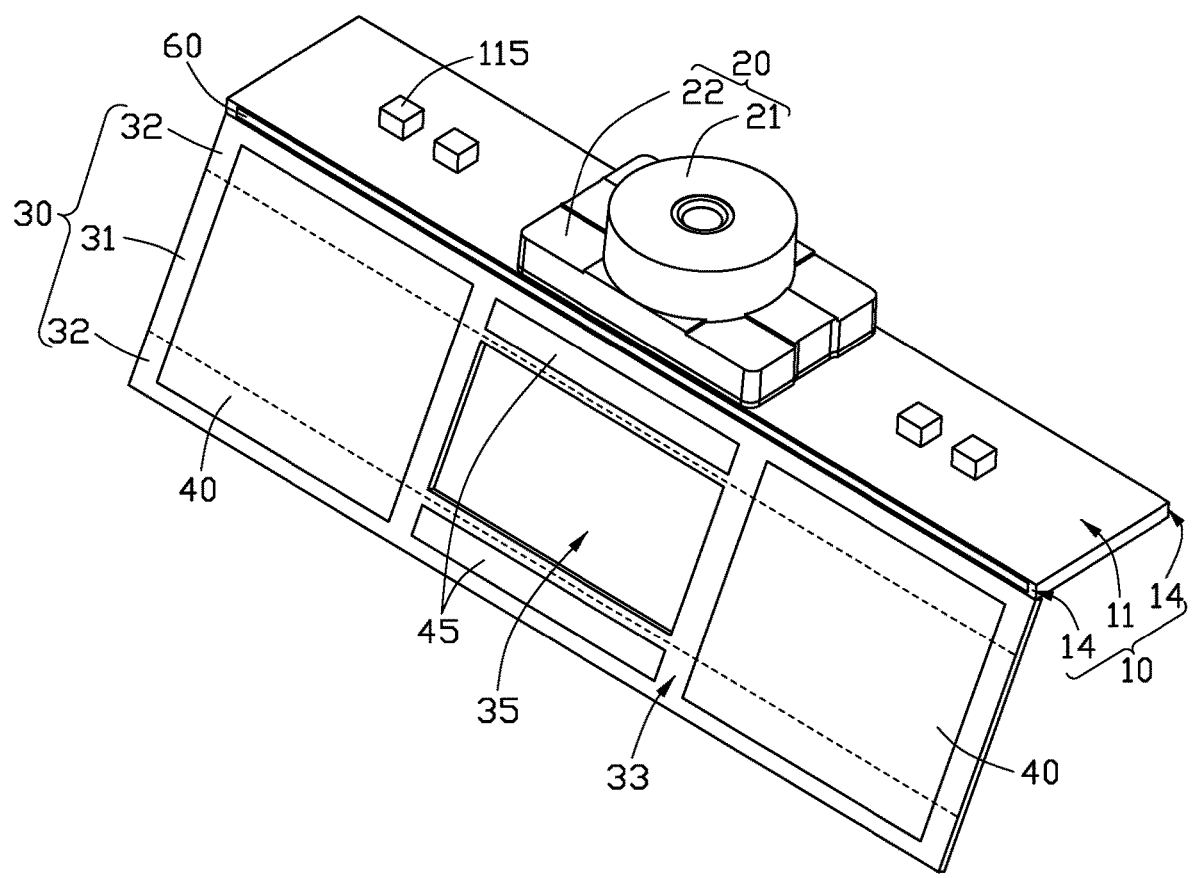
FIG. 3 is a diagrammatic view of a flexible board of the anti-magnetic interference component of FIG. 2, which is unfolded at an angle.
Figure 4:
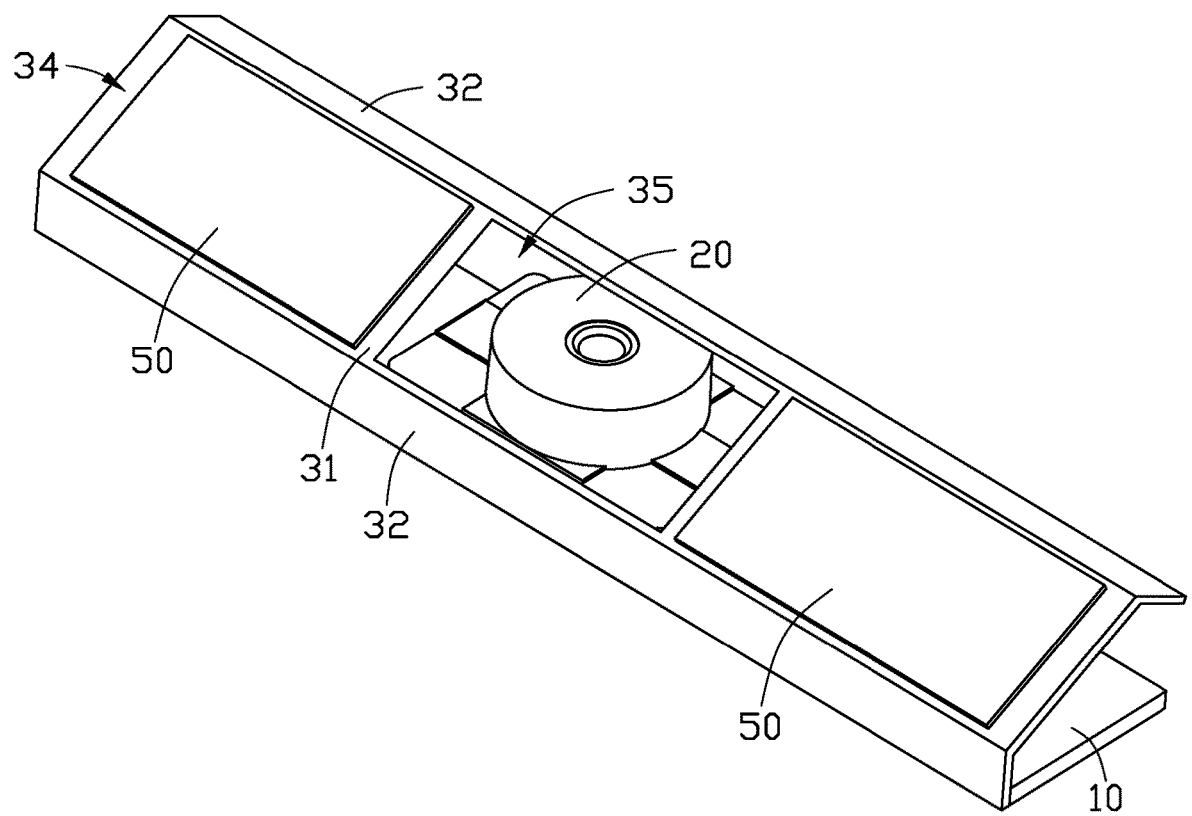
FIG. 4 is a diagrammatic view of the flexible board of the anti-magnetic interference component of FIG. 3, which is unfolded at another angle.

Referring to FIGS. 2 to 4, the anti-magnetic interference component 100 can include a circuit board 10, a lens assembly 20, a flexible board 30, at least one first electromagnetic shielding film 40, two second electromagnetic shielding films 45, and a plurality of electronic components 115. The electronic components 115 and the lens assembly 20 are disposed on the circuit board 10. The flexible board 30 can be bent and cover the circuit board 10, and the flexible board 30 covers the electronic components 115 and a portion of the lens assembly 20.

The circuit board 10 can be a hard circuit board. The circuit board 10 includes a supporting surface 11 and two side surfaces 14. The two side surfaces 14 are opposite to each other and connected to two sides of the supporting surface 11. The lens assembly 20 and the electronic components 115 are disposed on the supporting surface 11, and two sides of the flexible board 30 are corresponding connected to the two side surfaces 14.

The electronic components 115 are disposed on the supporting surface 11, and the electronic components 115 protrudes from the supporting surface 11. Each of the electronic components 115 can be a capacitor, a resistor, a sensor, and the like. At least one of the electronic components 115 are components that can be subject to electromagnetic interference. Or the at least one of the electronic components 115 can emit electromagnetic waves.

The flexible board 30 includes a covering portion 31 and two connecting portions 32 connected to two sides of the covering portion 31. When the flexible board covers the circuit board, the covering portion 31 is spaced apart from the supporting surface 11, and each connecting portion 32 is connected to one of the side surfaces 14. The flexible board 30 is approximately parallel to the supporting surface 11, and the connecting portions 32 are approximately perpendicular to the supporting surface 11. The flexible board 30 and the circuit board 10 cooperatively form a receiving space 17, and the electronic components 115 are disposed in the receiving space 17.

Referring to FIG. 3, in the embodiment, a first adhesive layer 60 is disposed between each side surface 14 and the corresponding connecting portions 32, and the flexible board 30 is bonded to the circuit board 10 through the first adhesive layer 60. The first adhesive layer 60 can be made of a black adhesive.

When the flexible board 30 covers the circuit board 10, the flexible board 30 includes a first surface 33 facing the circuit board 10 and a second surface 34 facing away from the circuit board 10. The first electromagnetic shielding film 40 is disposed on the first surface 33, and the first electromagnetic shielding film 40 is disposed on the covering portion 31 and the connecting portions 32. The first electromagnetic shielding film 40 is bendable and corresponds to positions of the electronic components 115. The first electromagnetic shielding film 40 can shield electromagnetic waves and prevent the electromagnetic waves from interfering with the electronic components 115, thereby improving the electromagnetic compatibility of the electronic device 300.

The lens assembly 20 includes a main body 21 and a protrusion 22. The main body 21 is disposed on the supporting surface 11, and the protrusion 22 is disposed on a surface of the main body 21 away from the circuit board 10. A through hole 35 is defined on the covering portion 31. The through hole 35 extends through the first surface 33 and the second surface 34. The protrusion 22 is exposed from the through hole 35, and the covering portion 31 covers the main body 21.

The second electromagnetic shielding films 45 are disposed on both sides of the through hole 35, and the second electromagnetic shielding films 45 are disposed corresponding to the main body 21 to realize electromagnetic shielding for the lens assembly 20.

Figure 5:
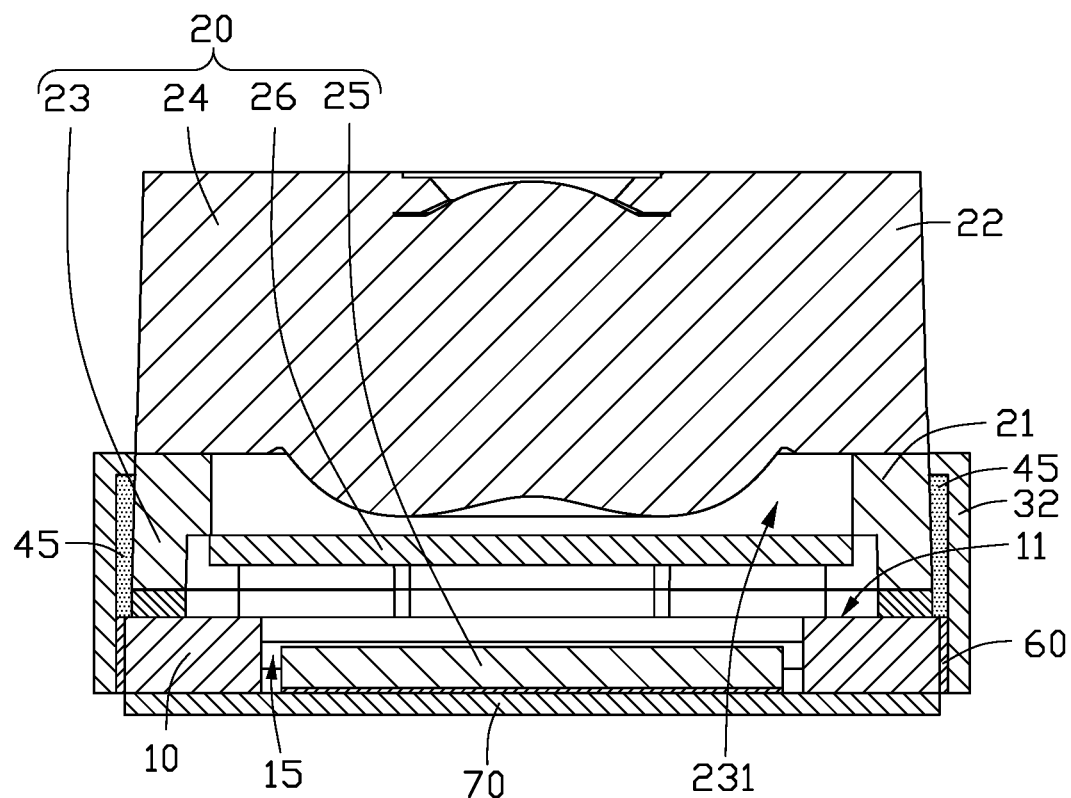
FIG. 5 is a cross-sectional view taken along line V-V of FIG. 2.

Referring to FIG. 5, the lens assembly 20 includes a base 23, a lens 24, an image sensor 25, and a filter 26. The base 23 is disposed on the supporting surface 11. An accommodating hole 15 is defined on the circuit board 10, and the image sensor 25 is accommodated in the accommodating hole 15, which can reduce a height of the anti-magnetic interference component 100. An accommodating cavity 231 is defined on the base 23, and the optical filter 26 is disposed in the accommodating cavity 231. The lens 24 is disposed on the base 23, and an optical axis the lens assembly 20 is collinear with a central axis of the lens 24, a central axis of the filter 26, and a central axis of the image sensor 25.

The first adhesive layer 60 bonds the circuit board 10 and the flexible board 30, and a portion of the second electromagnetic shielding films 40 disposed on the connecting portions 32 is disposed on both sides of the main body 21.

The anti-magnetic interference component 100 further includes a reinforcing plate 70 disposed on a surface away from the supporting surface 11, and the image sensor 25 is disposed on the reinforcing plate 70, which can improve a mechanical strength of the anti-magnetic interference component 100. The reinforcing plate 70 can be made of stainless steel.

Since the flexible board 30 has flexibility, the flexible board 30 can be flexibly bent or cut according to requirements when manufacturing the anti-magnetic interference component 100. The through hole 35 is flexibly designed according to a size and position of the lens assembly 20 or other electronic components, such better cover the protrusion 22 of the lens assembly 20 without affecting the operation of the lens assembly 20.

In some embodiments, the anti-magnetic interference component 100 further includes at least one metal layer 50 disposed on the second surface 34, the metal layer 50 can be made of copper or stainless steel. The metal layer 50 can increase electrostatic protection.

Figure 6:
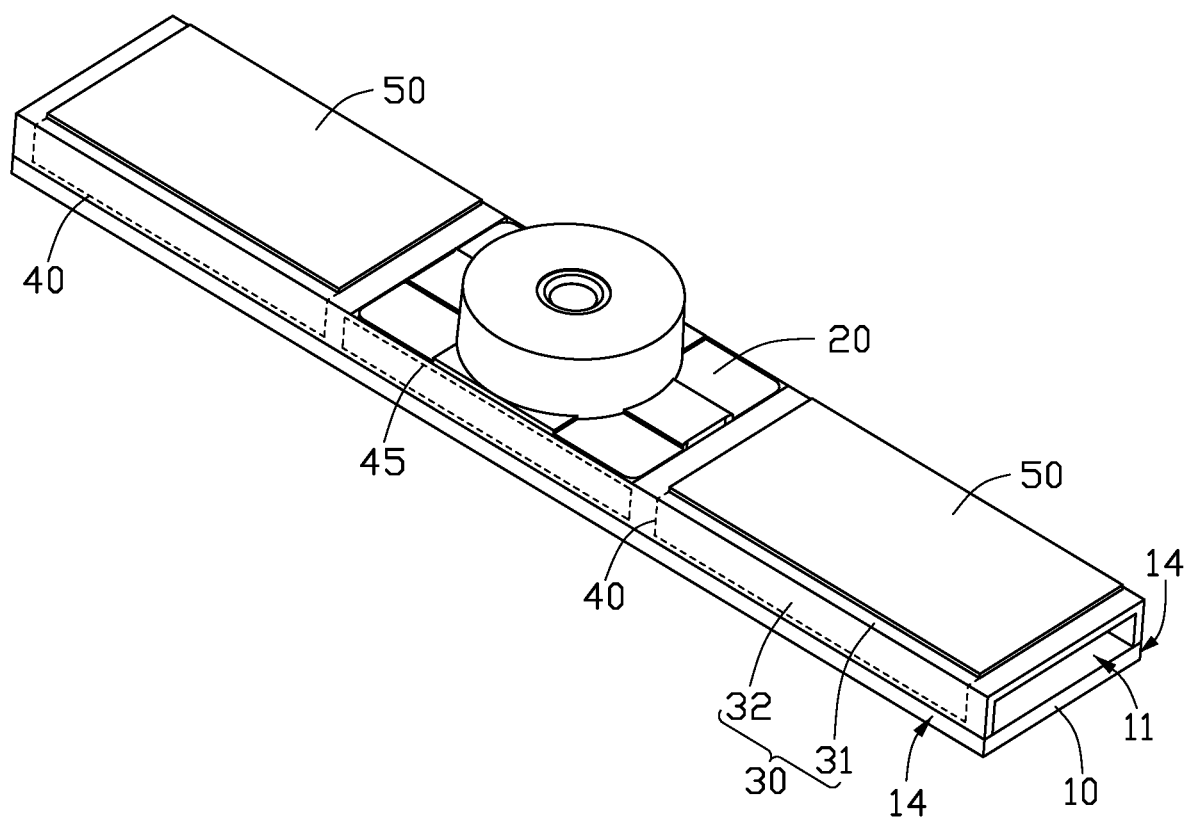
FIG. 6 is a diagrammatic view of another embodiment of an anti-magnetic interference component according to the present disclosure.

Referring to FIG. 6, an anti-magnetic interference component 100a is also provided according to another embodiment of the present disclosure. A difference between the anti-magnetic interference component 100 and the anti-magnetic interference component 100 is that the flexible board 30 of the anti-magnetic interference component 100a is disposed on the supporting surface 11 of the circuit board 10.

In the embodiment, both the connecting portions 32 are connected to the supporting surface 11, the covering portion 31 is spaced apart from the supporting surface 11, and the side surfaces 14 are exposed from the flexible board 30. Disposing the flexible board 30 on the supporting surface 11 instead of the side surfaces 14 can reduce a width of the anti-magnetic interference component 100a.

Figure 7:
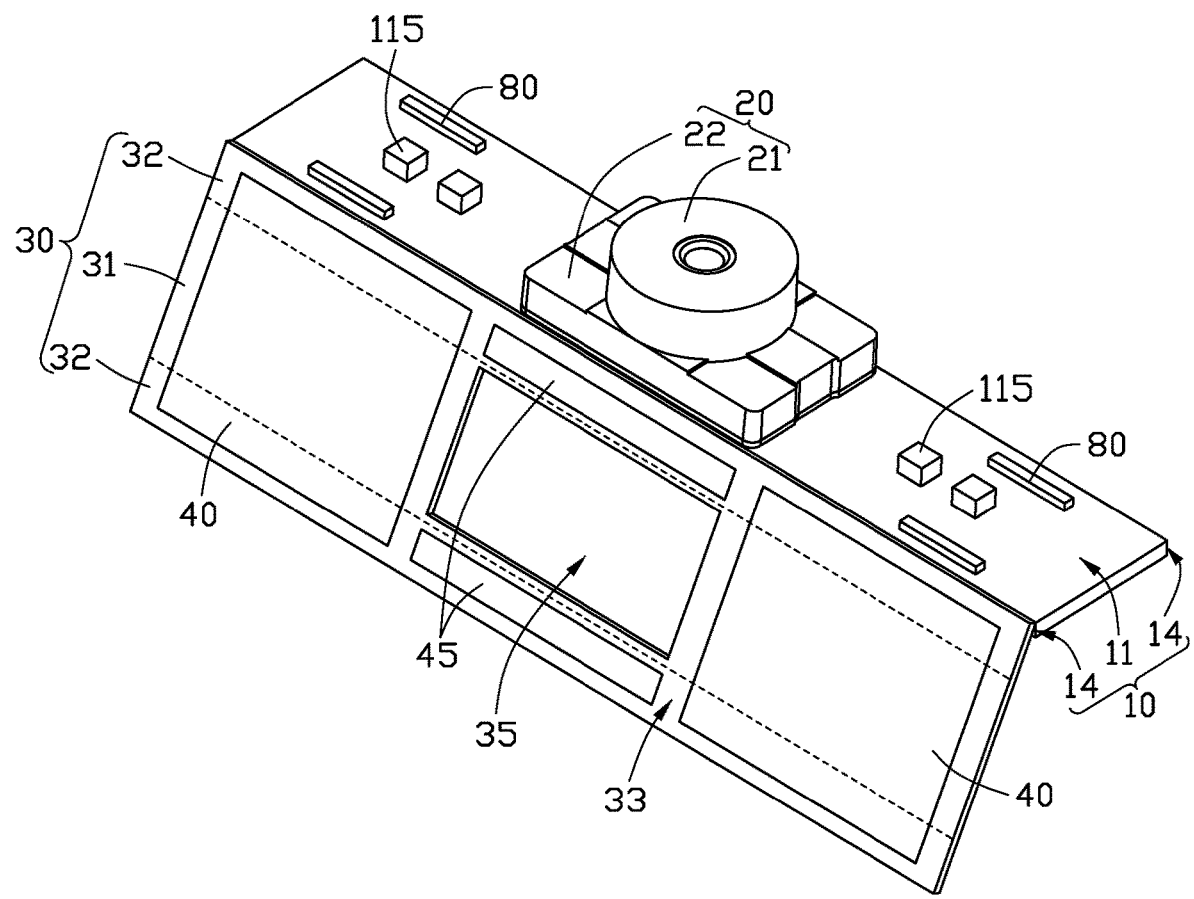
FIG. 7 is a diagrammatic view of a flexible board of the anti-magnetic interference component of FIG. 6, which is unfolded at an angle.

Referring to FIG. 7, a plurality of second adhesive layers 80 is defined on the supporting surface 11. The connecting portions 32 are pasted on the supporting surface 11 through the second adhesive layers 80. In the embodiment, the second adhesive layers 80 are silver adhesive.

The anti-magnetic interference component 100 (or 100a) includes the flexible board 30 provided on the surface of the circuit board 10 and the first electromagnetic shielding film 40 provided on the surface of the flexible board 30. The flexible board 30 can be folded and covers the electronic components 115, to shield electromagnetic waves and prevent the electromagnetic wave from interfering with the electronic components 115, thereby improving the electromagnetic compatibility of the electronic device 300. Wings can be formed on the flexible board 30, which can increase a wiring space, thus reducing a number of wiring layers of the circuit board 10 and/or the width of the circuit board 10. Thus, a size of the anti-magnetic interference component 100 can be reduced, which is beneficial to the miniaturization of the electronic device 300. Moreover, the flexible board 30 is connected to the circuit board 10, so that the flexible board 30 has a larger grounding area, causing the electrostatic to discharge faster.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. An anti-magnetic interference component, comprising:
   a circuit board;
   a plurality of electronic components disposed on the circuit board;
   a flexible board comprising a covering portion and two connecting portions connected to two sides of the covering portion, the covering portion configured to be bend relative to each of the two connecting portions, the two connecting portions connected to the circuit board, and the covering portion configured to cover and space apart from the circuit board when the covering portion is bend relative to each of the two connecting portions, causing the covering portion and the circuit board to cooperatively form an accommodation space for receiving the plurality of electronic components; and
   at least one first electromagnetic shielding film, each of the at least one first electromagnetic shielding film disposed on the covering portion and the two connecting portions, the at least one first electromagnetic shielding film configured to face the plurality of electronic components when the covering portion covers the circuit board.

2. The anti-magnetic interference component of claim 1, wherein the circuit board comprises a supporting surface and two side surfaces connected to two sides of the supporting surface, the plurality of electronic components is disposed on the supporting surface, each of the two connecting portions is configured to connect to a corresponding one of the two side surfaces, and the covering portion is spaced apart from the supporting surface when the covering portion covers the circuit board.

3. The anti-magnetic interference component of claim 2, further comprising a plurality of first adhesive layers, wherein one of the plurality of first adhesive layers is disposed between one of the two side surfaces and a corresponding one of the two connecting portions.

4. The anti-magnetic interference component of claim 1, wherein the circuit board comprises a supporting surface and two side surfaces connected to two sides of the supporting surface, the plurality of electronic components is disposed on the supporting surface, each of the two connecting portions is connected to the supporting surface, the two side surfaces are exposed from the flexible board, and the covering portion is spaced apart from the supporting surface when the covering portion covers the circuit board.

5. The anti-magnetic interference component of claim 4, further comprising a plurality of second adhesive layers, wherein the plurality of second adhesive layers is disposed between the supporting surface and the two connecting portions.

6. The anti-magnetic interference component of claim 5, further comprising at least one metal layer, wherein the at least one metal layer is disposed on a surface of the covering portion away from the circuit board when the covering portion covers the circuit board.

7. The anti-magnetic interference component of claim 6, wherein the at least one metal layer is made of copper or stainless steel.

8. The anti-magnetic interference component of claim 1, further comprising a lens assembly, wherein the lens assembly comprises a main body and a protrusion, the main body is disposed on the circuit board, the protrusion is disposed on a side of the main body away from the circuit board, a through hole is defined on the covering portion, and the protrusion is exposed from the through hole.

9. The anti-magnetic interference component of claim 8, further comprising two second electromagnetic shielding films, wherein the two second electromagnetic shielding films are disposed on the two connection portions and on two sides of the through hole.

10. An electronic device comprising an anti-magnetic interference component, the anti-magnetic interference component comprising:
a circuit board;
a plurality of electronic components disposed on the circuit board;
a flexible board comprising a covering portion and two connecting portions connected to two sides of the covering portion, the covering portion configured to be bend relative to each of the two connecting portions, the two connecting portions connected to the circuit board, and the covering portion configured to cover and space apart from the circuit board when the covering portion is bend relative to each of the two connecting portions, causing the covering portion and the circuit board to cooperatively form an accommodation space for receiving the plurality of electronic components; and
at least one first electromagnetic shielding film, each of the at least one first electromagnetic shielding film disposed on the covering portion and the two connecting portions, the at least one first electromagnetic shielding film configured to face the plurality of electronic components when the covering portion covers the circuit board.

11. The electronic device of claim 10, wherein the circuit board comprises a supporting surface and two side surfaces connected to two sides of the supporting surface, the plurality of electronic components is disposed on the supporting surface, each of the two connecting portions is configured to connect to a corresponding one of the two side surfaces, and the covering portion is spaced apart from the supporting surface when the covering portion covers the circuit board.

12. The electronic device of claim 11, further comprising a plurality of first adhesive layers, wherein one of the plurality of first adhesive layers is disposed between one of the two side surfaces and a corresponding one of the two connecting portions.

13. The electronic device of claim 10, wherein the circuit board comprises a supporting surface and two side surfaces connected to two sides of the supporting surface, the plurality of electronic components is disposed on the supporting surface, each of the two connecting portions is connected to the supporting surface, the two side surfaces are exposed from the flexible board, and the covering portion is spaced apart from the supporting surface when the covering portion covers the circuit board.

14. The electronic device of claim 13, further comprising a plurality of second adhesive layers, wherein the plurality of second adhesive layers is disposed between the supporting surface and the two connecting portions.

15. The electronic device of claim 14, further comprising at least one metal layer, wherein the at least one metal layer is disposed on a surface of the covering portion away from the circuit board when the covering portion covers the circuit board.

16. The electronic device of claim 15, wherein the at least one metal layer is made of copper or stainless steel.

17. The electronic device of claim 10, further comprising a lens assembly, wherein the lens assembly comprises a main body and a protrusion, the main body is disposed on the circuit board, the protrusion is disposed on a side of the main body away from the circuit board, a through hole is defined on the covering portion, and the protrusion is exposed from the through hole.

18. The electronic device of claim 17, further comprising two second electromagnetic shielding films, wherein the two second electromagnetic shielding films are disposed on the two connection portions and on two sides of the through hole.

* * * * *